(12) United States Patent
Araki

(10) Patent No.: US 11,379,072 B2
(45) Date of Patent: Jul. 5, 2022

(54) SEMICONDUCTOR DEVICE AND SEMICONDUCTOR SYSTEM HAVING THE SAME

(71) Applicant: RENESAS ELECTRONICS CORPORATION, Tokyo (JP)

(72) Inventor: Masahiro Araki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/839,945

(22) Filed: Apr. 3, 2020

(65) Prior Publication Data
US 2020/0379600 A1    Dec. 3, 2020

(30) Foreign Application Priority Data

May 27, 2019  (JP) .............................. JP2019-098605

(51) Int. Cl.
*G06F 3/041* (2006.01)
*H03K 17/687* (2006.01)
*G06F 3/044* (2006.01)
*H03K 17/96* (2006.01)
*G05F 3/26* (2006.01)

(52) U.S. Cl.
CPC ............ *G06F 3/0416* (2013.01); *G05F 3/262* (2013.01); *G06F 3/044* (2013.01); *H03K 17/6872* (2013.01); *H03K 17/962* (2013.01)

(58) Field of Classification Search
None
See application file for complete search history.

(56) References Cited

U.S. PATENT DOCUMENTS

| 9,543,947 | B2 | 1/2017 | Araki |  |
|---|---|---|---|---|
| 2012/0286800 | A1* | 11/2012 | Maharyta | G06F 3/0416 |
|  |  |  |  | 324/603 |
| 2013/0120053 | A1* | 5/2013 | Mei | G06F 3/044 |
|  |  |  |  | 327/517 |
| 2015/0002219 | A1* | 1/2015 | Araki | H03K 17/962 |
|  |  |  |  | 327/543 |
| 2017/0060165 | A1* | 3/2017 | Kim | G05F 3/262 |

FOREIGN PATENT DOCUMENTS

JP    2017-204900 A    11/2017

* cited by examiner

*Primary Examiner* — Christopher R Lamb
(74) *Attorney, Agent, or Firm* — McDermott Will & Emery LLP

(57) ABSTRACT

A semiconductor device comprises a pulse signal output circuit providing a pulse signal for a transmission electrode of an electrode pair, a current converter converting a first current generated on the reception electrode to a second current, a current-controlled oscillator outputting an oscillation signal having a frequency depending on the second current, and a counter counting a number of oscillating times of the oscillation signal per a predetermined period; wherein the current converter comprises a first constant current source and output a combined current of the first constant current of the first constant current source and the first current as the second current in response to the pulse signal, so that the semiconductor device suppresses an increase circuit size.

13 Claims, 9 Drawing Sheets

SEMICONDUCTOR DEVICE AND SEMICONDUCTOR SYSTEM HAVING THE SAME

CROSS-REFERENCE TO RELATED APPLICATIONS

The disclosure of Japanese Patent Application No. 2019-098605 filed on May 27, 2019 including the specification, drawings and abstract is incorporated herein by reference in its entirety.

BACKGROUND

The present invention relates to a semiconductor device and a semiconductor system including the same, and to a semiconductor device suitable for suppressing an increase in circuit scale, for example, and a semiconductor system including the same.

In the technical field of touch keys and touch screens, capacitive touch sensor circuits are generally employed. Japanese Unexamined Patent Application Publication No. 2017-204900 (Patent Document 1) discloses a configuration of a mutual-capacitive touch sensor for detecting whether or not touch electrodes are touched by finger.

The touch sensor includes a power-supply voltage drop circuit for generating a constant voltage applied to the touch electrode pair to generate an electric field in the touch electrode pair, a current-controlled oscillator for outputting a clock signal having a frequency corresponding to a value of a current flowing when the constant voltage is applied from the power-supply voltage drop circuit to the touch electrode pair, and a counter for counting the number of oscillating times per predetermined period of the clock signal output from the current-controlled oscillator. The touch sensor is provided with a tank capacitor for suppressing a variation in the constant voltage generated by the power-supply voltage drop circuit.

SUMMARY

However, in the configuration of the touch sensor of the related art, since a pair of power-supply voltage drop circuit and a tank capacitor are required for each touch electrode pair, there is a problem that the circuit scale increases. In particular, when sensing of a plurality of touch electrode pairs is performed in parallel, in the configuration of the touch sensor of the related art, a plurality of sets of power-supply voltage drop circuits and tank capacitors corresponding to the plurality of touch electrode pairs are required, so that an increase in the circuit size becomes remarkable. Other objects and novel features will become apparent from the description of this specification and the accompanying drawings.

According to one embodiment, the semiconductor device includes a pulse signal output circuit providing a pulse signal for a transmission electrode of an electrode pair including the transmission electrode and a reception electrode, a current converter converting a first current generated on the reception electrode to a second current, a current-controlled oscillator outputting an oscillation signal having a frequency depending on the second current, and a counter counting a number of oscillating times of the oscillation signal per a predetermined period. The current converter comprises a first constant current source outputting a first constant current, a first transistor being diode-connected and having a source-drain path through which a combined current of the first constant current and the first current flows, a second transistor being current mirror connected to the first transistor, and a third transistor being coupled in series to the second transistor and outputting the second current by switching ON/OFF in response to the pulse signal.

According to the above-mentioned embodiment, it is possible to provide a semiconductor device capable of suppressing an increase in circuit size and a semiconductor system including the semiconductor device.

DETAILED DESCRIPTION

Figure 1:
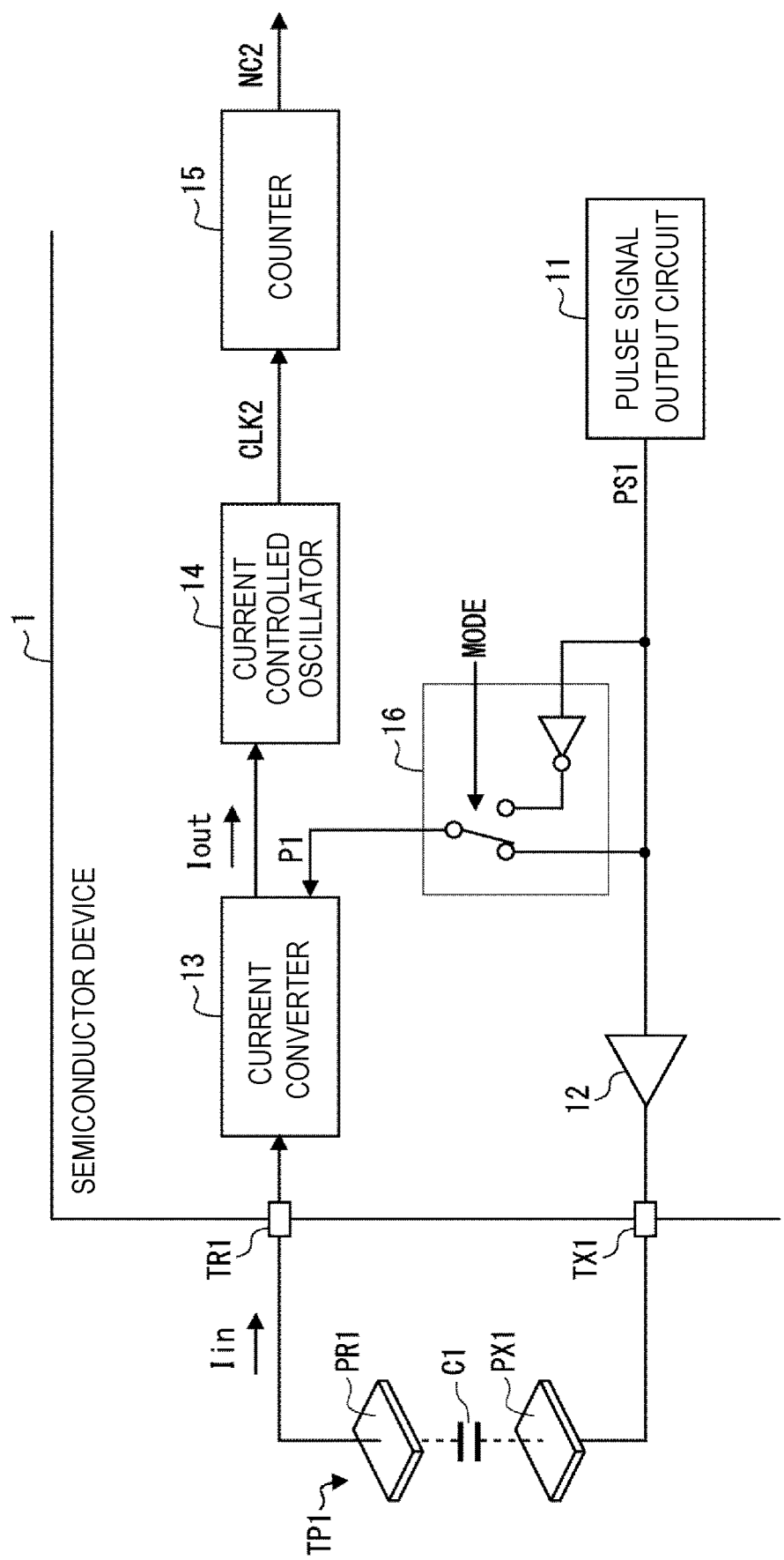
FIG. 1 is a diagram showing a configuration example of semiconductor device according to a first embodiment.

For clarity of explanation, the following description and drawings are appropriately omitted and simplified. In addition, the elements described in the drawings as functional blocks for performing various processes can be configured as CPUs (Central Processing Unit), memories, and other circuits in terms of hardware, and are realized by programs loaded into the memories in terms of software. Therefore, it is understood by those skilled in the art that these functional blocks can be realized in various forms by hardware alone, software alone, or a combination thereof, and the present invention is not limited to any of them. In the drawings, the same elements are denoted by the same reference numerals, and a repetitive description thereof is omitted as necessary.

Also, the programs described above may be stored and provided to a computer using various types of non-transitory computer readable media. Non-transitory computer readable media includes various types of tangible storage media. Examples of non-transitory computer-readable media include magnetic recording media (e.g., flexible disks, magnetic tapes, hard disk drives), magneto-optical recording media (e.g., magneto-optical disks), CD-ROM (Read Only Memory, a CD-R, a CD-R/W, solid-state memories (e.g., masked ROM, PROM (Programmable ROM), EPROM (Erasable PROM, flash ROM, RAM (Random Access Memory)). The program may also be supplied to the computer by various types of transitory computer-readable media. Examples of transitory computer-readable media include electrical signals, optical signals, and electromagnetic waves. The transitory computer readable medium may provide the program to the computer via wired or wireless communication paths, such as electrical wires and optical fibers.

First Embodiment

FIG. 1 is a diagram showing a configuration example of a semiconductor device 1 according to a first embodiment. The semiconductor device 1 according to the present embodiment is used as a mutual-capacitive touch sensor, and has a function of sensing a touch electrode pair without using a power-supply voltage drop circuit and a tank capacitor. As a result, semiconductor device 1 according to the present embodiment can suppress an increase in the circuit size. Hereafter, a concrete description will be given.

As shown in FIG. 1, semiconductor device 1 includes a pulse signal output circuit 11, a driver 12, a current converter 13, a current-controlled oscillator (CCO) 14, a counter 15, and terminal TX1, TR1. Also shown in FIG. 1 is a touch electrode pair TP1. Of the components of semiconductor device 1, FIG. 1 shows only the components of the capacitance detecting unit that detects a change in the capacitance of the touch electrode pair TP1.

The touch electrode pair TP1 includes a transmission electrode PX1 and a reception electrode PR1. The transmission electrode PX1 are connected to a terminal TX1 of semiconductor device 1. The reception electrode PR1 are connected to a terminal TR1 of semiconductor device 1. By applying voltages between the electrodes of the touch electrode pair TP1 by semiconductor device 1, a capacitance C1 is formed between the electrodes of the touch electrode pair TP1.

For example, when the grounded finger FNG and the touch electrode pair TP1 are sufficiently separated from each other, the value of the capacitance Cf formed between the finger FNG and the electrode PX1, PR1 is negligibly smaller than the value of the capacitance C1 formed between the electrodes PX1, PR1.

On the other hand, as the distances between the finger FNG and the touch electrode pair TP1 become shorter, the number of electric lines of force absorbed by the finger FNG among the plurality of electric lines of force formed between the electrodes PX1, PR1 increases. Therefore, as the distances between the fingers FNG and the touch electrode pair TP1 become shorter, the capacitance value of the capacitance C1 formed between the electrodes PX1, PR1 becomes smaller. The semiconductor device 1 can detect that the finger FNG touches (or approaches) the touch electrode pair TP1 by detecting a change in the capacitance C1 at this time.

In the semiconductor device 1, the pulse signal output circuit 11 outputs a pulse signal PS1 having a predetermined frequency. The driver 12 outputs the pulse signal PS1 to the terminal TX1. As a result, the pulse signal PS1 is applied to the transmission electrode PX1 of the touch electrode pair TP1 via the terminal TX1.

The pulse signal switching circuit 16 selects the pulse signal PS1 or its inverted signal based on the switching signal MODE, and outputs the selected pulse signal as the pulse signal P1. The pulse signal P1 is input to the current converter 13. In this embodiment, the pulse signal PS1 is selected when MODE is 1, and the inverted signal of the pulse signal PS1 is selected when MODE is 0.

The current converter 13 converts the current Iin generated in the reception electrode PR1 by changing of the pulse signal PS1 applied to the transmission electrode PX1 into a current Iout and outputs the current Iout. The current Iin has a current value proportional to the capacitance C1 and amplitudes of the pulse signal PS1.

<Specific Configuration Example of the Current Converter 13>

Figure 2:
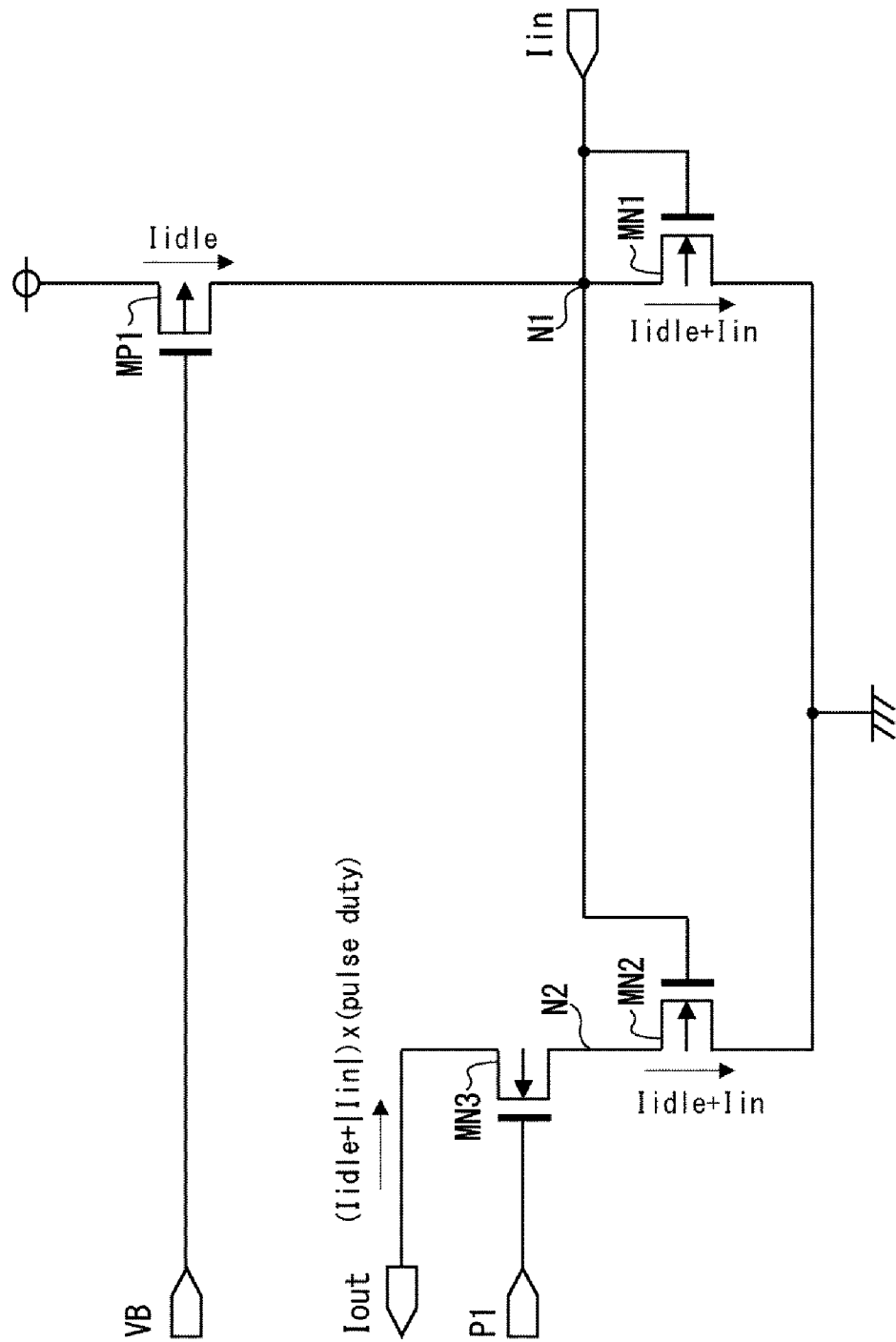
FIG. 2 is a circuit diagram showing a specific configuration of a current converter provided in semiconductor device shown in FIG. 1.

FIG. 2 is a circuit diagram showing a specific configuration example of a current converter 13. As shown in FIG. 2, the current converter 13 includes a P-channel MOS transistor (hereinafter simply referred to as a transistor) MP1 and N-channel MOS transistors (hereinafter simply referred to as a transistor) MN1 to MN3.

In the transistor MP1, the source is coupled to the power-supply voltage terminal VDD, the drain is coupled to the node N1, and the bias voltage VB is applied to the gate. That is, the transistor MP1 constitutes a constant current source. As a result, a constant current (idle current) Iidle flows between the source and the drain of the transistor MP1.

In the transistor MN1 (first transistor), the source is coupled to the ground-voltage terminal GND, and the drain and the gate are coupled to the node N1. That is, the transistor MN1 is diode-connected.

The terminal TR1 is further connected to the node N1. Therefore, a combined current (Iidle+Iin) of the constant current Iidle supplied from the transistor MP1 to the node N1 and a current Iin supplied from the reception electrode PR1 to the node N1 via the terminal TR1 flows between the source and the drain of the transistor MN1.

In the transistor MN2 (second transistor), the source is coupled to the ground-voltage terminal GND, the drain is coupled to the node N2, and the gate is coupled to the node N1. That is, the transistor MN2 is current mirror connected to the transistor MN1. As a result, a current proportional to the current flowing between the source and the drain of the transistor MN1 flows between the source and the drain of the transistor MN2. In FIG. 2, the current (Iidle+Iin) having the same current value as the current flowing between the source and the drain of the transistor MN1 flows between the source and the drain of the transistor MN2.

In the transistor MN3 (third transistor), the source is connected to the node N2, the drain is connected to the output terminal of the current converter 13, and the gate is applied with the pulse signal P1. The transistor MN3 is turned on and off by the pulse signal P1.

<The Operation of Current Converter 13>

Figure 3:
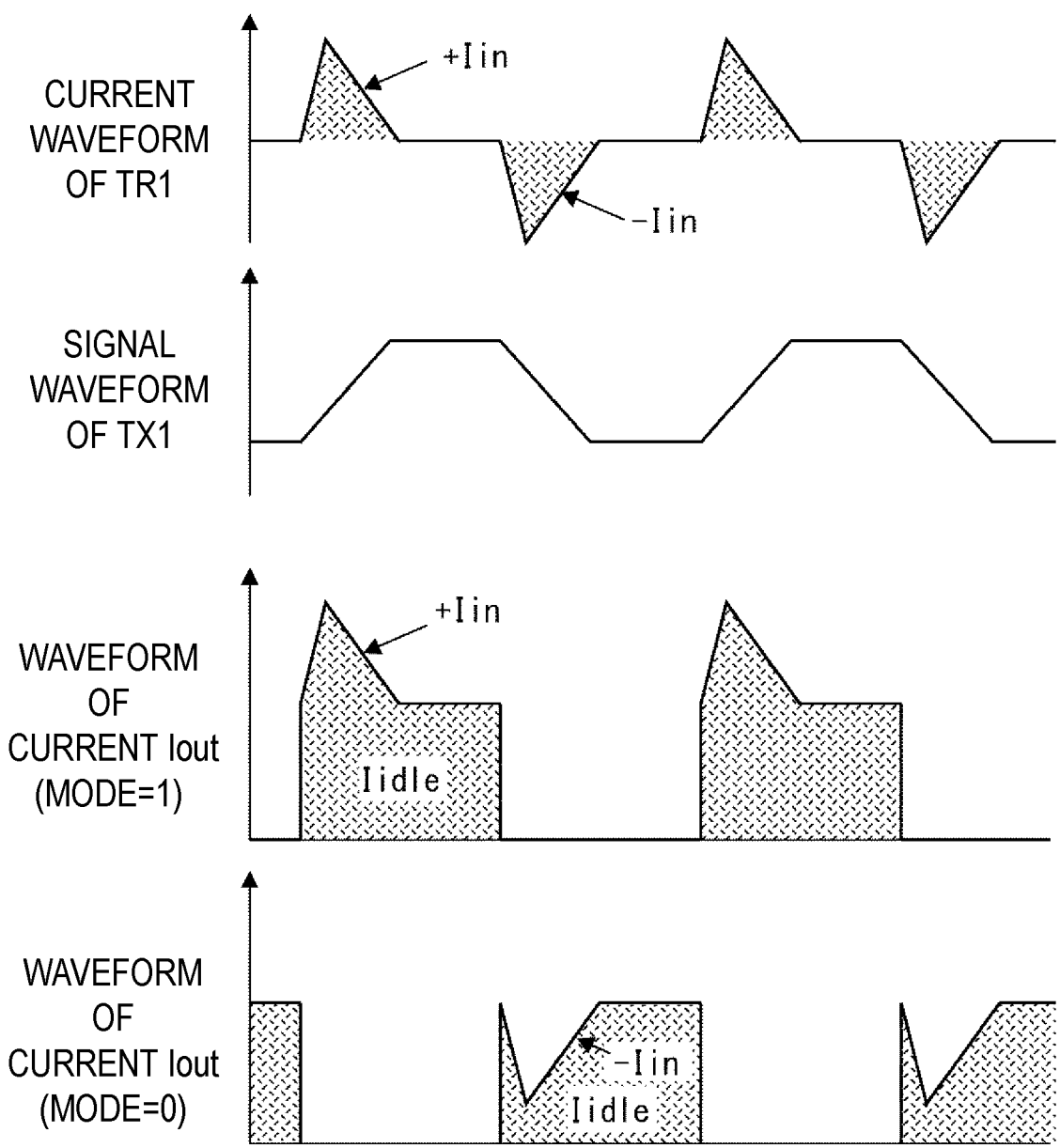
FIG. 3 is a diagram showing current waveforms for explaining the operation of the current converter shown in FIG. 2.

Next, the operation of the current converter 13 will be described with reference to FIG. 3. FIG. 3 is a diagram showing current waveforms for explaining the operation of the current converter 13.

First, the operation of the current converter 13 when the pulse signal switching circuit 16 outputs the pulse signal PS1 as it is as the pulse signal P1 (when MODE is 1) will be described.

For example, when the pulse signal PS1 rises, a current Iin of positive polarity is temporarily generated in the reception electrode PR1, i.e., the terminal TR1. At this time, in the current converter 13, the transistor MN3 is switched from off to on in response to the rise of the pulse signal P1. As a result, the current Iidle+Iin flows between the source and the drain of the transistor MN3. The current converter 13 outputs the current Iidle+Iin as the current Iout while the pulse signal P1 is at the H level.

Thereafter, when the pulse signal PS1 falls, a current Iin of negative polarity is temporarily generated in the reception electrode PR1 in response to the fall of the pulse signal PS1. At this time, in the current converter 13, the transistor MN3 is switched from on to off in response to the fall of the pulse signal P1. As a result, no current flows between the source and the drain of the transistor MN3. The current converter 13 maintains the output current Iout at 0 A while the pulse signal P1 is at L-level.

That is, the current converter 13 outputs a current obtained by multiplying the current Iidle+Iin by the duty ratio of the pulse signal P1 as the current Iout.

Next, the operation of the current converter 13 when the pulse signal switching circuit 16 outputs the inverted signal of the pulse signal PS1 as the pulse signal P1 (when MODE is 0) will be described.

For example, when the pulse signal PS1 rises, the current Iin of positive polarity is temporarily generated in the reception electrode PR1, i.e., the terminal TR1. At this time, in the current converter 13, the transistor MN3 is switched from on to off in response to the fall of the pulse signal P1. As a result, no current flows between the source and the drain of the transistor MN3. The current converter 13 maintains the output current Iout at 0 A while the pulse signal P1 is at L-level.

Thereafter, when the pulse signal PS1 falls, the current Iin of negative polarity is temporarily generated in the reception electrode PR1 in response to the fall of the pulse signal PS1. At this time, in the current converter 13, the transistor MN3 is switched from off to on in response to the rise of the pulse signal P1. As a result, a current Iidle−Iin flows between the source and the drain of the transistor MN3. The current converter 13 outputs the current Iidle−Iin as the current Iout while the pulse signal P1 is at the H level.

That is, the current converter 13 outputs a current obtained by multiplying the current Iidle−Iin by the duty ratio of the pulse signal P1 as the current Iout.

The current-controlled oscillator 14 outputs a clock signal (oscillation signal) CLK2 having a frequency depending on the current Iout outputted from the current converter 13. Specifically, the current-controlled oscillator 14 includes a ring oscillator and a buffer circuit. In the ring oscillator, a plurality of inverter circuits whose delay times vary according to the current Iout are connected in a ring shape. The buffer circuit amplifies the output of the last inverter circuit of the plurality of inverter circuits and outputs the amplified output as a clock signal CLK2. The counter 15 counts the number of oscillating times of the clock signal CLK2 per a predetermined period, and outputs a count value NC2.

Figure 4:
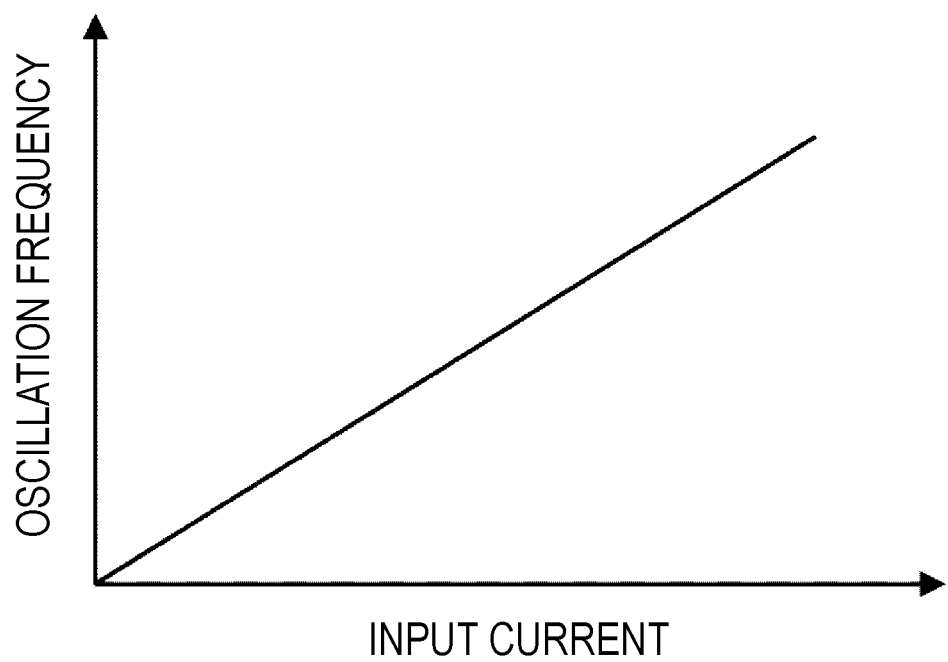
FIG. 4 is a diagram showing a relationship between an input current and an output oscillation frequency of a current-controlled oscillator provided in semiconductor device shown in FIG. 1.

FIG. 4 is a diagram showing the relationship between the input current and the output oscillation frequency of the current-controlled oscillator 14. For example, when the value of the current Iout increases, the delay times of the inverters provided in the current-controlled oscillator 14 decrease, so that the frequency of the clock signal CLK2 increases, and as a result, the count value NC2 increases. On the other hand, when the value of the current Iout decreases, the delay times of the inverters provided in the current-controlled oscillator 14 increase, so that the frequency of the clock signal CLK2 decreases, and as a result, the count value NC2 decreases.

The semiconductor device 1 can obtain the capacitance value of the capacitance C1 of the touch electrode pair TP1 by the difference of current Iin based on the count value NC2 when the current value of the current Iout is Iidle (i.e., Iin=0) and the count value NC2 when the current value of the current Iout is Iidle+Iin (or Iidle−Iin).

As described above, the semiconductor device 1 according to the present embodiment detects a change in the capacitance of the touch electrode pair TP1 by using the current converter 13 that does not include the power-supply voltage drop circuit including an amplifier and the like. The semiconductor device 1 according to the present embodiment also does not require a tank capacitor. As a result, semiconductor device 1 according to the present embodiment can suppress an increase in the circuit size. As a result, semiconductor device 1 according to the present embodiment can suppress an increase in the circuit size even when a circuit configuration for measuring the respective capacitances of a plurality of touch electrode pairs in parallel is mounted.

In the present embodiment, although either the pulse signal PS1 or the inverted signal thereof which is selected by the pulse signal switching circuit 16 is inputted to the current converter 13, the present invention is not limited thereto. Only one of the pulse signal PS1 and the inverted pulse signal may be inputted to the current converter 13. Alternatively, the pulse signal switching circuit 16 may be provided between the pulse signal output circuit 11 and the driver 12, the pulse signal PS1 may be selectively inputted to the current converter 13, and the pulse signal PS1 and its inverted signal may be selectively inputted to the driver 12.

In the present embodiment, the case where the capacitance value of the capacitance C1 of the touch electrode pair TP1 is obtained by the difference current Iin based on the count value NC2 in the case where the current value of the current Iout indicates Iidle and the count value NC2 in the case where the current value of the current Iout indicates Iidle+Iin (or Iidle−Iin) has been described as an example, but the present invention is not limited thereto. The capacitance value of the capacitance C1 of the touch electrode pair TP1 may be obtained based on the difference between the count value NC2 when the current value of the current Iout indicates Iidle+Iin and the count value NC2 when the current value of the current Iout indicates Iidle−Iin. In this instance, since the difference between the counted values corresponds to the difference current 2*Iin and the variation components of the constant current Iidle are canceled, the measurement accuracy of the variation amount of the capacitance value of the capacitance C1 is improved.

Second Embodiment

Next, the semiconductor device 2 according to a second embodiment will be described. Compared with the semiconductor device 1, the semiconductor device 2 according to the present embodiment includes a current converter 23 instead of the current converter 13. The rest of the configuration of semiconductor device 2 is the same as that of semiconductor device 1, and therefore the explanation thereof is omitted.

Figure 5:
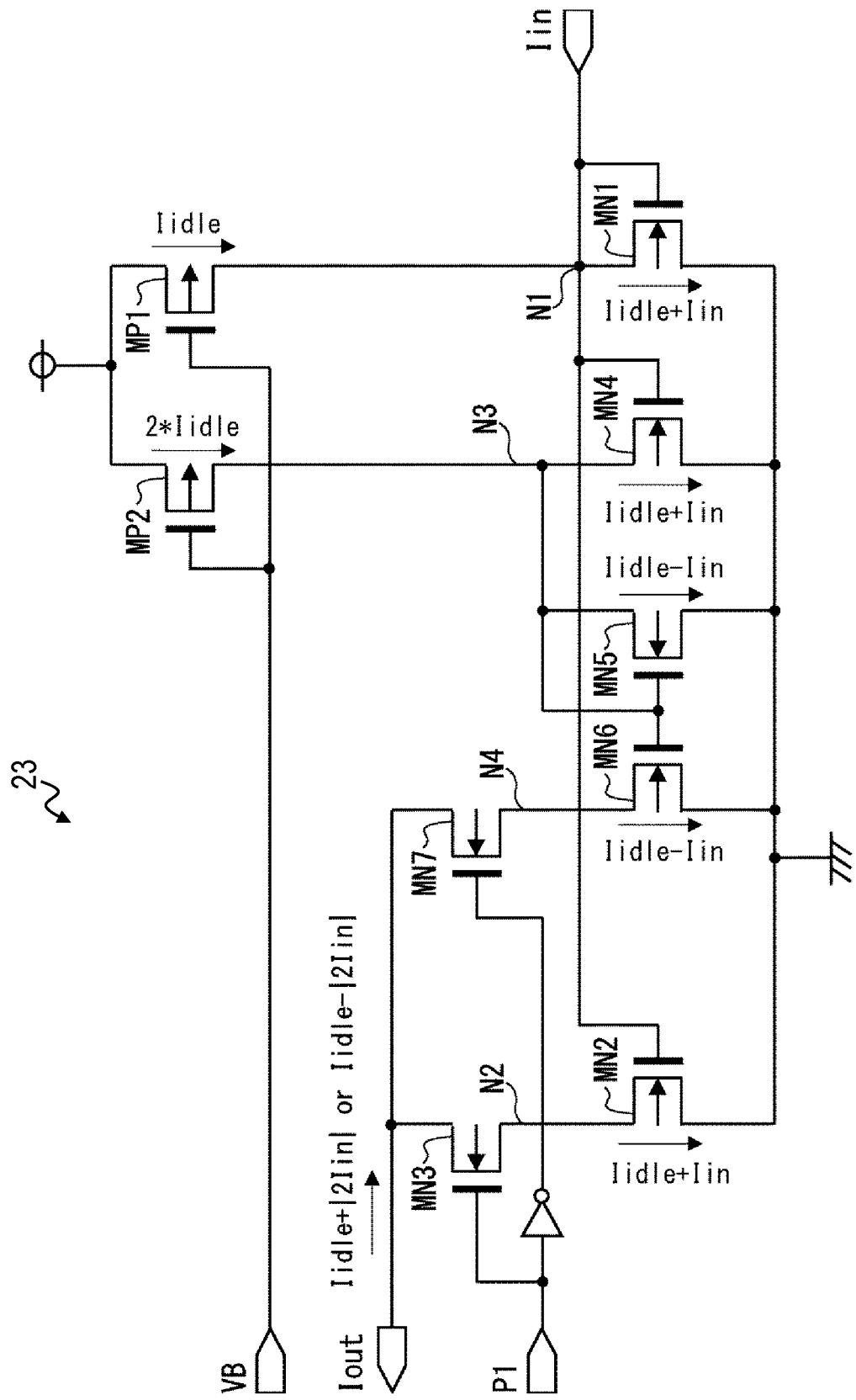
FIG. 5 is a circuit diagram showing a specific configuration example of a current converter provided in semiconductor device according to a second embodiment.

FIG. 5 is a circuit diagram showing a specific configuration example of the current converter 23. As shown in FIG. 5, the current converter 23 further includes a P-channel MOS transistor (hereinafter simply referred to as a transistor) MP2 and an N-channel MOS transistor (hereinafter simply referred to as a transistor) MN4 to MN7 as compared with the current converter 13.

In the transistor MP2, the source is coupled to the power-supply voltage terminal VDD, the drain is coupled to the node N3, and the bias voltage VB is applied to the gate. That is, the transistor MP2 constitutes a constant current source. Here, in the case of FIG. 5, the current driving capability of the transistor MP2 is twice the current driving capability of the transistor MP1. Therefore, a constant current (idle current) 2*Iidle twice the constant current Iidle flowing between the source and the drain of the transistor MP1 flows between the source and the drain of the transistor MP2.

In the transistor MN4 (fourth transistor), the source is coupled to the ground-voltage terminal GND, the drain is coupled to the node N3, and the gate is coupled to the node N1. That is, the transistor MN4 is current mirror connected to the transistor MN1. As a result, a current proportional to the current flowing between the source and the drain of the transistor MN1 flows between the source and the drain of the transistor MN4. In FIG. 5, a current Iidle+Iin having the same current value as the current flowing between the source and the drain of the transistor MN1 flows between the source and the drain of the transistor MN4.

In the transistor MN5 (fifth transistor), the source is coupled to the ground-voltage terminal GND, and the drain and the gate are coupled to the node N3. That is, the transistor MN5 is diode-connected. Therefore, a difference current (Iidle−Iin) between the constant current 2*Iidle flowing from the transistor MN2 to the node N3 and the current (Iidle+Iin) flowing from the node N3 to the transistor MN4 flows between the source and the drain of the transistor MN5.

The transistor MN6 (sixth transistor) has a source coupled to the ground-voltage terminal GND, a drain coupled to the node N4, and a gate coupled to the node N3. That is, the transistor MN6 is current mirror connected to the transistor MN5. As a result, a current proportional to the current flowing between the source and the drain of the transistor MN5 flows between the source and the drain of the transistor MN6. In FIG. 5, a current Iidle−Iin having the same current as the current flowing between the source and the drain of the transistor MN5 flows between the source and the drain of the transistor MN6.

In the transistor MN7 (seventh transistor), the source is connected to the node N4, the drain is connected to the output terminal of the current converter 23, and the inverted signal PB1 of the pulsed signal P1 is applied to the gate. The transistor MN7 is turned on and off in a manner complementary to the transistor MN3 by the pulsed signals PB1.

Since the other configuration of the current converter 23 is the same as that of the current converter 13, the description thereof is omitted.

<The Operation of Current Converter 23>

Figure 6:
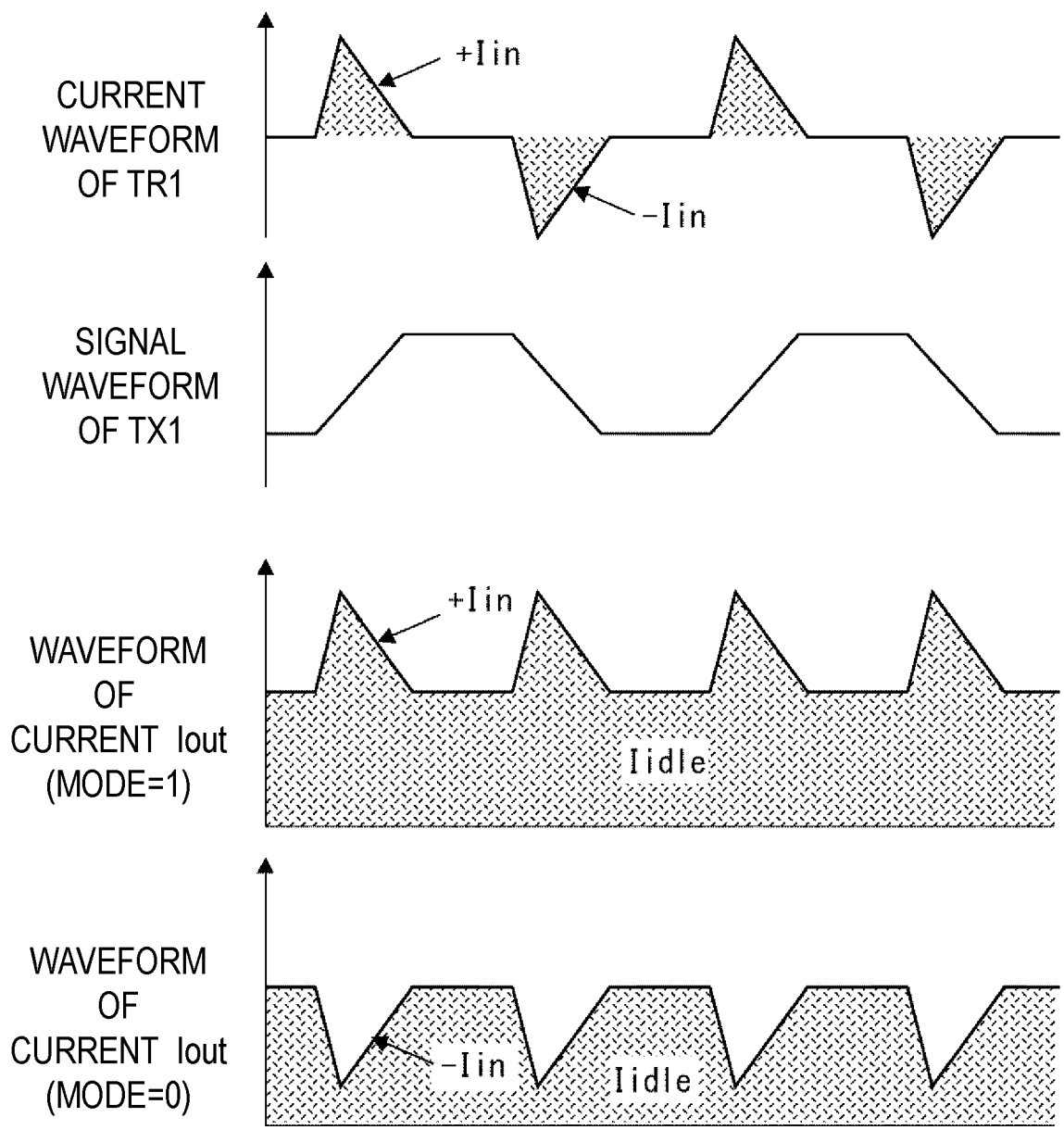
FIG. 6 is a diagram showing current waveforms for explaining the operation of the current converter shown in FIG. 5.

Next, the operation of the current converter 23 will be described with reference to FIG. 6. FIG. 6 is a diagram showing current waveforms for explaining the operation of the current converter 23.

First, the operation of the current converter 23 when the pulse signal switching circuit 16 outputs the pulse signal PS1 as it is as the pulse signal P1 (when MODE is 1) will be described.

For example, when the pulse signal PS1 rises, a current Iin of positive polarity is temporarily generated in the reception electrode PR1, i.e., the terminal TR1. At this time, in the current converter 23, the transistor MN3 is turned on by the rise of the pulse signal P1, and the transistor MN7 is turned off by the fall of the pulse signal PB1. As a result, a current Iidle+Iin flows between the source and the drain of the transistor MN3. The current converter 23 outputs the current Iidle+Iin as the current Iout while the pulse signal PS1 is at the H level. Since the current Iin at this time has a positive polarity, the current Iout can also be expressed as a current Iidle+|Iin|.

Thereafter, when the pulse signal PS1 falls, a current Iin of negative polarity is temporarily generated in the reception electrode PR1 in response to the fall of the pulse signal PS1. At this time, in the current converter 13, the transistor MN3 is turned off by the fall of the pulse signal P1, and the transistor MN7 is turned on by the rise of the pulse signal PB1. As a result, a current Iidle−Iin flows between the source and the drain of the transistor MN7. The current converter 23 outputs the current Iidle−Iin as the current Iout while the pulse signal PS1 is at the L-level. Since the current Iin at this time has a negative polarity, the current Iout can also be expressed as a current Iidle+|Iin|.

That is, the current converter 23 outputs the current Iidle+|2*Iin| as the current Iout.

Next, the operation of the current converter 13 when the pulse signal switching circuit 16 outputs the inverted signal of the pulse signal PS1 as the pulse signal P1 (when MODE is 0) will be described.

For example, when the pulse signal PS1 rises, a current Iin of positive polarity is temporarily generated in the reception electrode PR1, i.e., the terminal TR1. At this time, in the current converter 23, the transistor MN3 is turned off by the fall of the pulse signal P1, and the transistor MN7 is turned on by the rise of the pulse signal PB1. As a result, a current Iidle−Iin flows between the source and the drain of the transistor MN7. The current converter 23 outputs the current Iidle−Iin as the current Iout while the pulse signal PS1 is at the H level. Since the current Iin at this time has a positive polarity, the current Iout can also be expressed as a current Iidle−|Iin|.

Thereafter, when the pulse signal PS1 falls, a current Iin of negative polarity is temporarily generated in the reception electrode PR1 in response to the fall of the pulse signal PS1. At this time, in the current converter 13, the transistor MN3 is turned on by the rise of the pulse signal P1, and the transistor MN7 is turned off by the fall of the pulse signal PB1. As a result, a current Iidle+Iin flows between the source and the drain of the transistor MN3. The current converter 23 outputs the current Iidle+Iin as the current Iout while the pulse signal PS1 is at the L level. Since the current Iin at this time has a negative polarity, the current Iout can also be expressed as a current Iidle−|Iin|.

That is, the current converter 23 outputs the current Iidle−|2*Iin| as the current Iout.

As described above, the semiconductor device 2 according to the present embodiment detects a change in the capacitance of the touch electrode pair TP1 by using the current converter 23 that does not include a power-supply voltage drop circuit including an amplifier and the like as a constituent element. The semiconductor device 2 according to the present embodiment also does not require a tank capacitor. As a result, semiconductor device 2 according to the present embodiment can suppress an increase in the circuit size. As a result, the semiconductor device 2 according to the present embodiment can suppress an increase in the circuit size even when a circuit configuration for measuring the respective capacitances of a plurality of touch electrode pairs in parallel is mounted.

Further, in the semiconductor device 2 according to the present embodiment, the current converter 23 outputs a current Iout including both positive and negative currents Iin generated at the reception electrodes PR1. As a result, the semiconductor device 2 according to the present embodiment can improve the detecting accuracy by about twice as much as that of semiconductor device 1. Alternatively, the semiconductor device according to the present embodiment can obtain equivalent detection accuracy in about one-half of the time compared with the case of the semiconductor device 1.

In the present embodiment, although either the pulse signal PS1 or the inverted signal thereof which is selected by the pulse signal switching circuit 16 is inputted to the current converter 23, the present invention is not limited thereto. Only one of the pulse signal PS1 and the inverted pulse signal may be inputted to the current converter 23.

In the present embodiment, the case where the capacitance value of the capacitance C1 of the touch electrode pair TP1 is obtained by the difference current |2*Iin| between the count value NC2 in the case where the current value of the current Iout indicates Iidle and the count value NC2 in the case where the current value of the current Iout indicates Iidle+|2*Iin| (or Iidle−|2*Iin|) has been described as an example, but the present invention is not limited thereto. The capacitance value of the capacitance C1 of the touch electrode pair TP1 may be obtained based on the difference between the count value NC2 when the current value of the current Iout indicates Iidle+|2*Iin| and the count value NC2 when the current value of the current Iout indicates Iidle−|2*Iin|. In this instance, since the difference between the counted values corresponds to the difference current 4*Iin and the variation components of the constant current Iidle are canceled, the measurement accuracy of the variation amount of the capacitance value of the capacitance C1 is improved.

Third Embodiment

Next, the semiconductor device 3 according to a third embodiment will be described. Compared with the semiconductor device 2, the semiconductor device 3 according to the present embodiment includes a current converter 33 instead of the current converter 23. The rest of the configuration of semiconductor device 3 is the same as that of semiconductor device 2, and therefore the explanation thereof is omitted.

Figure 7:
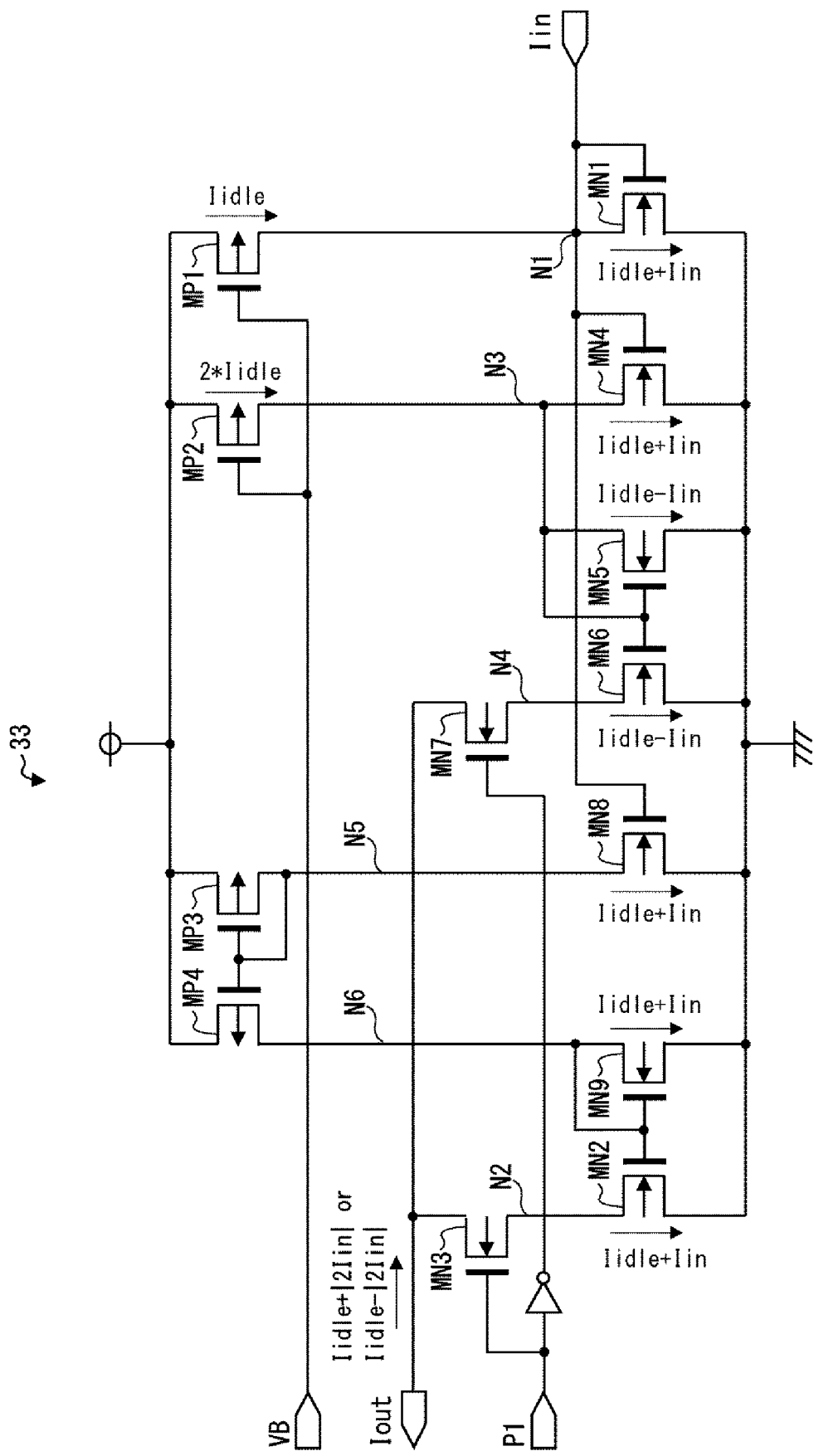
FIG. 7 is a circuit diagram showing a specific configuration example of a current converter provided in semiconductor device according to a third embodiment.

FIG. 7 is a circuit diagram showing a specific configuration example of the current converter 33. As shown in FIG. 7, the current converter 33 further includes a P-channel MOS transistor (hereinafter simply referred to as a transistor) MP3, MP4 and an N-channel MOS transistor (hereinafter simply referred to as a transistor) MN8, MN9 as compared with the current converter 23. The transistors MP3, MP4, MN8, MN9 constitute current mirror circuits.

In the transistor MN8 (eighth transistor), the source is connected to the ground-voltage terminal GND, the drain is connected to the node 5, and the gate is connected to the node N1. That is, the transistor MN8 is current mirror connected to the transistor MN1. As a result, a current proportional to the current flowing between the source and the drain of the transistor MN1 flows between the source and the drain of the transistor MN8. In FIG. 7, a current Iidle+Iin having the same current value as the current flowing between the source and the drain of the transistor MN1 flows between the source and the drain of the transistor MN8.

In the transistor MP3 (ninth transistor), the source is coupled to the power supply terminal VDD, and the drain and the gate are coupled to the node N5. In the transistor MP4 (tenth transistor), the source is coupled to the power supply terminal VDD, the drain is coupled to the node N6, and the gate is coupled to the node N5.

In the transistor MN9 (eleventh transistor), the source is coupled to the ground-voltage terminal GND, and the drain and the gate are coupled to the node N6. Therefore, a current proportional to the current flowing between the source and the drain of the transistor MN8 flows between the source and the drain of the transistor MN9. In FIG. 7, a current Iidle+Iin having the same current value as the current flowing between the source and the drain of the transistor MN8 flows between the source and the drain of the transistor MN9.

Here, instead of being coupled to the node N1, the gate of the transistor MN2 is coupled to the node N6. That is, the voltage of the node N1 is applied to the gate of the transistor MN2 through the current mirror circuit composed of the transistors MP3, MP4, MN8, and MN9.

Since the other configuration of the current converter 33 is the same as that of the current converter 23, the description thereof is omitted.

The semiconductor device 3 on the present embodiment is as effective as semiconductor device 2. Further, in semiconductor device 3 according to the present embodiment, the current converter 33 is configured so that the current Iin of impulsive current waveforms is not directly applied to the gate of the transistor MN7 by providing a current mirror circuit between the gate of the transistor MN7 and the current input terminal of the current converter 33. As a result, the current converter 33 can blunt the current waveforms of the current Iout. As a result, the current Iout is suppressed within the range of the input current range of the current controlled oscillator 14 of the next stage, so that the measurement characteristics are improved.

In the present embodiment, a current mirror circuit is added between the gate of the transistor MN7 and the current inputs of the current converter 33 in addition to the current converter 23 provided in the semiconductor device 2. Of course, even when a current mirror circuit is added between the gates of the transistors MN7 and the current inputs of the current converter 33 in the current converter 13 provided in semiconductor device 1, the measurement characteristic is improved.

Fourth Embodiment

Next, the semiconductor device 4 according to a fourth embodiment will be described. Compared with the semiconductor device 3, the semiconductor device 4 according to the present embodiment includes a current converter 43 instead of the current converter 33, and further includes a dummy transistor MP6. The rest of the configuration of semiconductor device 4 is the same as that of semiconductor device 3, and therefore the explanation thereof is omitted.

Figure 8:
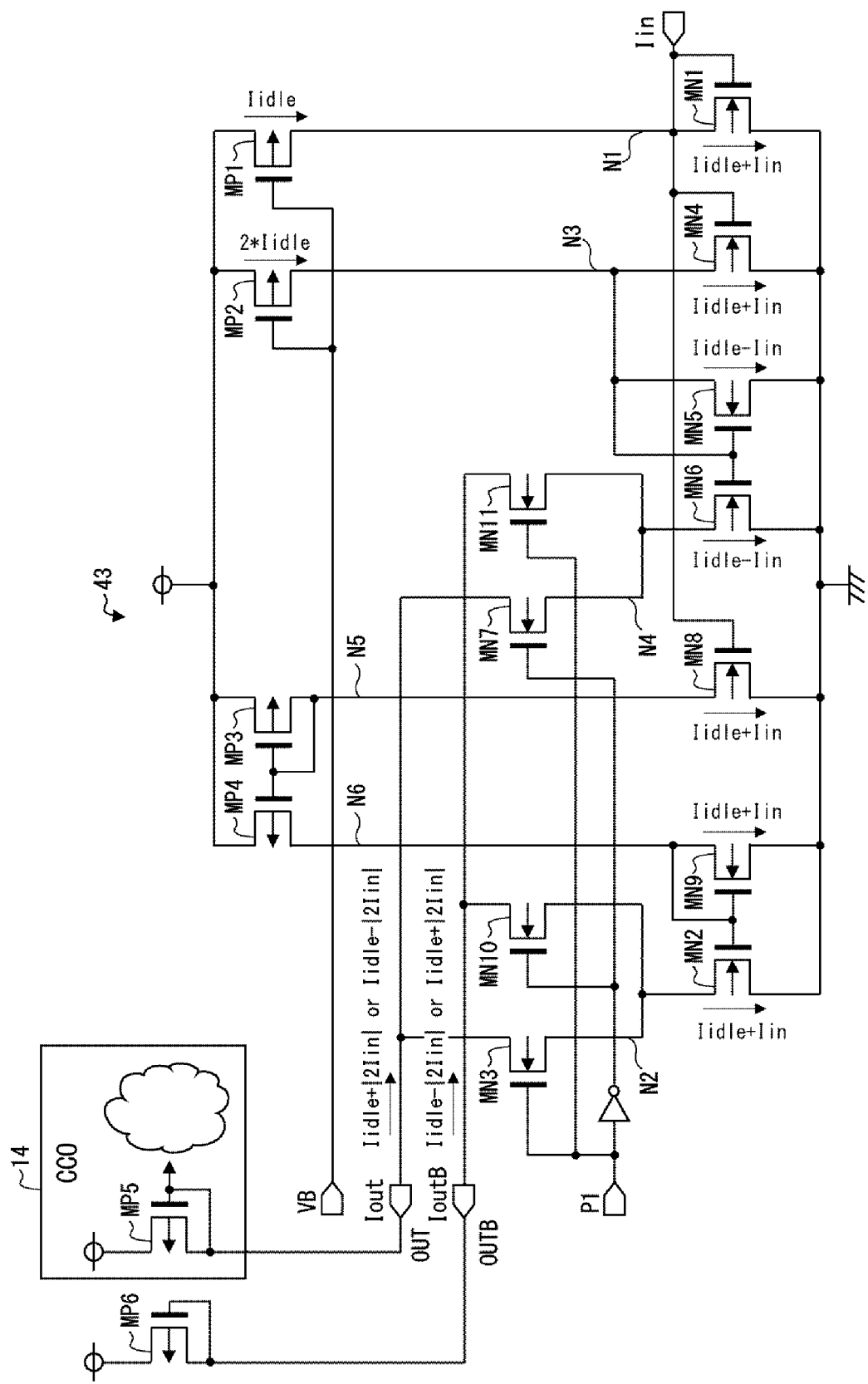
FIG. 8 is a circuit diagram showing a specific configuration example of a current converter provided in semiconductor device according to a fourth embodiment.

FIG. 8 is a circuit diagram showing a specific configuration example of the current converter 43. As shown in FIG. 8, the current converter 43 further includes an N-channel MOS transistor MN10, MN11 as compared with the current converter 33. The current converter 43 further includes an output terminal OUTB for outputting a current IoutB in addition to an output terminal OUT for outputting a current Iout.

In the transistor MN10 (twelfth transistor), the source is coupled to the node N2, the drain is coupled to the output terminal OUTB of the current converter 43, and the inverted signal PB1 of the pulse signal P1 is applied to the gate. The transistor MN10 is turned on and off by the pulse signal PB1. In the transistor MN11 (thirteenth transistor), the source is coupled to the node N4, the drain is coupled to the output terminal OUTB of the current converter 43, and the gate is applied with the pulse signal P1. The transistor MN11 is turned on and off by the pulse signal P1. That is, the transistors MN10, MN11 turn on and off complementarily to the transistors MN3, MN7.

Therefore, when the current value of the current Iout flowing through the output terminal OUT indicates Iidle+|2*Iin|, the current value of the current IoutB flowing through the output terminal OUTB indicates |Iidle−|2*Iin||. On the other hand, when the current value of the current Iout flowing through the output terminal OUT indicates |Iidle−|2*Iin||, the current value of the current IoutB flowing through the output terminal OUTB indicates |Iidle+|2*Iin||.

The dummy transistor MP6 is a P-channel MOS transistor and is provided corresponding to a P-channel MOS transistor MP5 provided in the input stage of the current controlled oscillator 14. It is preferable that the dummy transistor MP6 has the same size and the same shape as the transistor MP5.

Specifically, in the transistor MP5 provided in the input stage of the current-controlled oscillator 14, the source is coupled to the power-supply voltage terminal VDD, and the drain and the gate are coupled to the output terminal OUT of the current converter 43. In the dummy transistor MP6, a source is coupled to the power-supply voltage terminal VDD, and a drain and a gate are coupled to the output terminal OUTB of the current converter 43.

On the node N2, parasitic capacitances such as junction capacitances and interconnection capacitances of the electrodes and the like of the transistors MN2, MN3, MN10, for example, exists. On the node N4, parasitic capacitances such as junction capacitances and interconnection capacitances of the electrodes and the like of the transistors MN6, MN7, MN11, for example, exists.

Here, in the current converter 33 shown in FIG. 7, when the transistor MN3 is turned off, the voltage of the node N2 is discharged to the ground level 0V. Therefore, after that, when the transistor MN3 is switched from off to on, not only a desired current Iidle+Iin but also an extra current for charging and discharging the parasitic capacitance of the node N2 flows between the source and the drain of the transistor MN3. Similarly, in the current converter 33 shown in FIG. 7, when the transistor MN7 is turned off, the voltage of the node N4 is discharged to the ground level 0V. Therefore, when the transistor MN7 is switched from off to on thereafter, not only a desired current Iidle−Iin but also an extra current for charging and discharging the parasitic capacitance of the node N4 flows between the source and the drain of the transistor MN7. As a result, an extra current for charging and discharging the parasitic capacitances of the nodes N2 and N4 is included in the current Iout as error components. This error component increases in proportion to an increase in the frequency of the pulse signal P1.

On the other hand, in the current converter 43 shown in FIG. 8, even if the transistor MN3 is turned off, the transistor MN10 is turned on to supply electric charge to the node N2, so that the voltage of the node N2 is not discharged to the ground level. Therefore, after that, when the transistor MN3 is switched from off to on, an extra current flowing between the source and the drain of the transistor MN3 (current for charging and discharging the parasitic capacitance) is suppressed. Similarly, in the current converter 43 shown in FIG. 8, even if the transistor MN7 is turned off, since the transistor MN11 is turned on to supply electric charge to the node N4, the voltage of the node N4 is not discharged to the ground level. Therefore, after that, when the transistor MN7 is switched from off to on, an extra current flowing between the source and the drain of the transistor MN7 (current for charging and discharging the parasitic capacitance) is suppressed. As a result, the error components included in the current Iout are suppressed.

In the present embodiment, the transistors MN10, MN11 are added to the current converter 33 provided in semiconductor device 3 so as not to discharge the nodes N2 and N4 to the ground level, but the present invention is not limited to this. As a matter of course, the transistor MN10 may be added to the current converter 13 provided in semiconductor device 1 so as not to discharge the node N2 to the ground level. In addition, the transistors MN10, MN11 may be added to the current converter 23 provided in semiconductor device 2 so as not to discharge the nodes N2 and N4 to the ground level.

<Application Case of Semiconductor Device 1>

Figure 9:
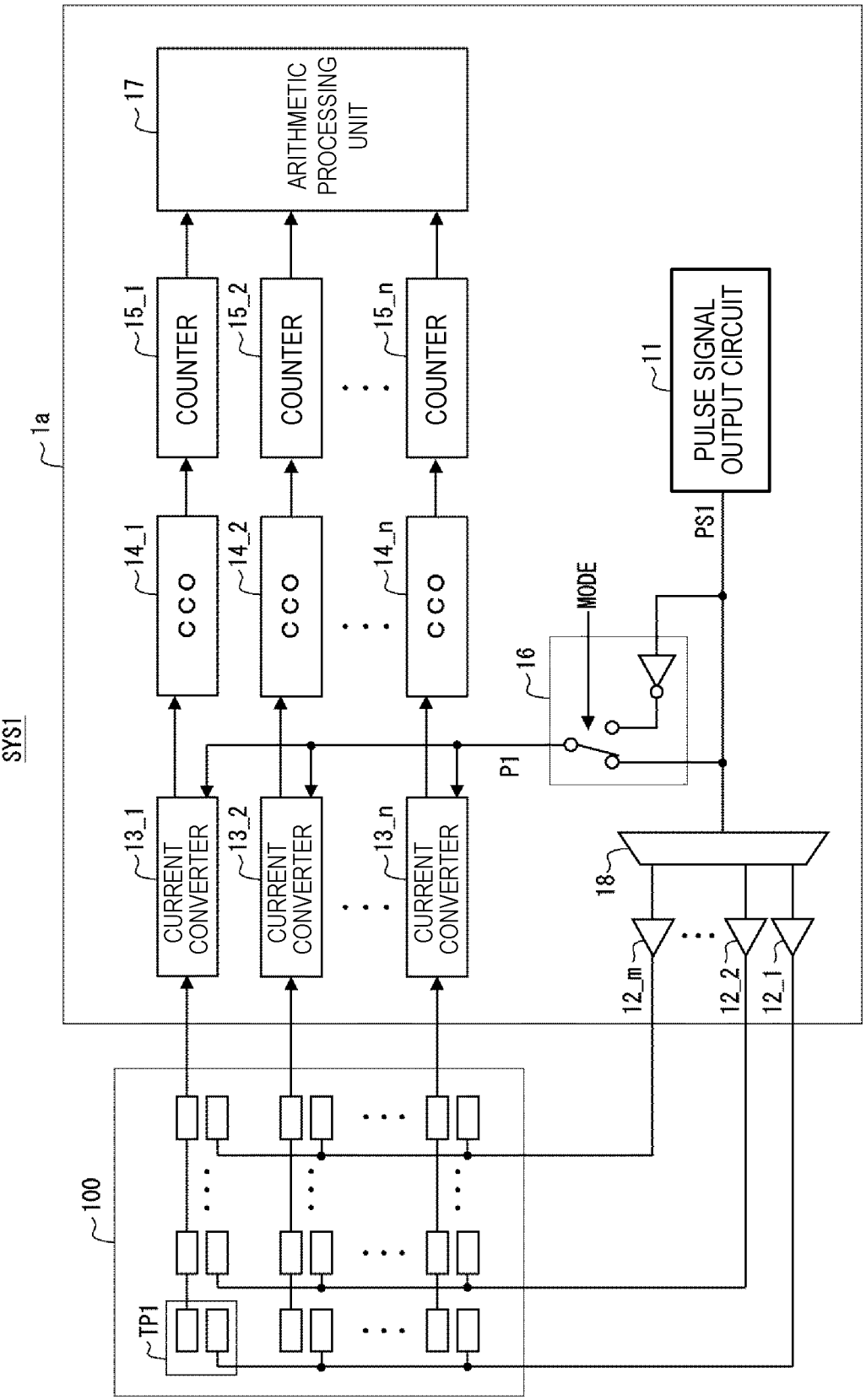
FIG. 9 is a diagram showing a configuration example of a sensor system applying the semiconductor device according to the first embodiment.

Subsequently, the application case of the semiconductor device 1 will be described using FIG. 9. FIG. 9 is a diagram showing an exemplary configuration of a sensor system (semiconductor system) SYS1 to which semiconductor device 1 is applied.

As shown in FIG. 9, the sensor system SYS1 includes a touch screen 100 and a semiconductor device 1a corresponding to semiconductor device 1. A plurality of touch electrode pairs TP1 of n rows*m columns are arranged on the touch screen 100. The semiconductor device 1a includes a pulse signal output circuit 11, selector 18, drivers 12_1 to 12_m, current converters 13_1 to 13-n, current controlled oscillators 14_1 to 14_n, counters 15_1 to 15_n, a pulse signal switching circuit 16, and an arithmetic processing unit (CPU) 17.

The selector 18 selectively outputs the pulse signal PS1 output from the pulse signal output circuit 11 to any one of the drivers 12_1 to 12_m. Each of the drivers 12_1 to 12_m corresponds to the driver 12, and selectively outputs the pulse signal PS1 to the transmission electrodes of the n-th touch electrode pair TP1 in the first to m-th columns, respectively.

Each of the current converters 13_1 to 13_n corresponds to the current converter 13, and converts the currents Iin_1 to Iin_n generated in any one of the m touch electrodes of the first to n-th row and the reception electrodes of TP1 into the currents Iout_1 to Iout_n. Each of the current controlled oscillators 14_1 to 14_n corresponds to the current controlled oscillator 14. The current controlled oscillators 14_1 to 14_n output clock signals CLK2_1 to CLK2_n each having frequency corresponding to the currents Iout_1 to Iout_n, respectively. Each of the counters 15_1 to 15_n corresponds to the counter 15. The counters 15_1 to 15_n count the number of oscillating times of the clock signals CLK2_1 to CLK2_n per predetermined period, and output count values NC2_1 to NC2_n, respectively. Based on the count values NC2_1 to NC2_n, the arithmetic processing unit 17 detects which touch electrode pair TP1 is touched by the finger. Since the rest of the configuration of semiconductor device 1a is the same as that of semiconductor device 1, the description thereof is omitted.

Here, although a plurality of current converters 13_1 to 13_n are provided in semiconductor device 1a, the circuit sizes of the respective current converters 13_1 are small as described above. Therefore, the sensor system SYS1 can suppress an increase in the circuit size.

In this embodiment, although the pulse signal P1 is input to the respective current converters 13_1 to 13_n, similarly to the first embodiment, the pulse signal switching circuit 16, which is input the pulse signal PS1, may be provided between the pulse signal output circuit 11 and the selector 18, so that the drivers 12_1 to 12-m are selectively supplied one of the pulse signal PS1 and its inverted signal.

Although the configuration of semiconductor device 1 is applied to the sensor system in this embodiment, the present invention is not limited to this, and any one of the configurations of semiconductor device 2 to 4 may be applied to the sensor system.

As described above, semiconductor device according to the first embodiment to the fourth embodiment detects a change in the capacitance of the touch electrode pair TP1 by using a current converter which does not include a power-supply voltage drop circuit including an amplifier and the like. In addition, semiconductor device according to the first embodiment to the fourth embodiment does not require a tank capacitor. Thus, semiconductor device according to the first embodiment to the fourth embodiment can suppress an increase in the circuit size. As a result, semiconductor device according to the first embodiment to the fourth embodiment can suppress an increase in the circuit size even when a circuit configuration for measuring the capacitance of each of a plurality of touch electrode pairs in parallel is mounted.

Although the invention made by the inventor has been specifically described based on the embodiment, the present invention is not limited to the embodiment already described, and it is needless to say that various modifications can be made without departing from the gist thereof.

For example, in the above-described embodiment according to semiconductor device, the conductivity type (p-type or n-type) of semiconductor substrate, the semiconducting layer, the diffusion layer (diffusion area), or the like may be inverted. Therefore, in the case where one of the conductivity types of the n-type or the p-type is the first conductivity type and the other conductivity type is the second conductivity type, the first conductivity type can be the p-type and the second conductivity type can be the n-type, or on the contrary, the first conductivity type can be the n-type and the second conductivity type can be the p-type.

What is claimed is:

1. A semiconductor device comprising:
   a pulse signal output circuit providing a pulse signal to a transmission electrode of an electrode pair including the transmission electrode and a reception electrode;
   a current converter converting a first current generated on the reception electrode into a second current;
   a current-controlled oscillator outputting an oscillation signal having a frequency depending on the second current, and
   a counter counting a number of oscillating times of the oscillation signal per a predetermined period,
   wherein the current converter comprises a first constant current source outputting a first constant current, and converts a combined current of the first constant current and the first current into the second current, and
   wherein the current converter further comprises:
      a first transistor that is diode-connected and has a source-drain path through which the combined current flows;
      a second transistor that is current mirror connected to the first transistor; and
      a third transistor that is coupled in series to the second transistor and outputs the second current by switching ON/OFF in response to the pulse signal.

2. The semiconductor device according to claim 1, further comprising:
   a pulse signal switching circuit selecting the pulse signal or an inverted signal thereof which is output to the current converter and the transmission electrode.

3. The semiconductor device according to claim 2, further comprising an arithmetic processing unit,
   wherein the arithmetic processing unit detects a capacitance value between the transmission electrode and the reception electrode depending on a difference between a first count value and a second count value,
   wherein the first count value is based on the second current when the pulse signal is output from the pulse signal switching circuit, and
   wherein the second count value is based on the second current when the inverted signal of the pulse signal is output from the pulse signal switching circuit.

4. The semiconductor device according to claim 1, wherein the current converter further comprises a current-mirror circuit controlling a current flowing through a source-drain path of the second transistor depending on a current flowing through the source-drain path of the first transistor.

5. The semiconductor device according to claim 4, wherein the current-mirror circuit comprises:
   an eighth transistor being current mirror-connected to the first transistor;
   a ninth transistor being coupled in series to the eighth transistor and having a conductivity type different from a conductivity type of the eighth transistor;
   a tenth transistor being current mirror-connected to the ninth transistor and having a same conductivity type as the conductivity type of the ninth transistor; and
   an eleventh transistor being coupled in series to the tenth transistor and having a same conductivity type as the conductivity type of the eighth transistor, and
   wherein the second transistor is current mirror-connected to the eleventh transistor.

6. The semiconductor device according to claim 1, wherein the current converter further comprises:
   a second constant current source outputting a second constant current proportional to the first constant current;
   a fourth transistor being coupled in series to the second constant current source and being current mirror-connected to the first transistor;
   a fifth transistor being diode-connected and having a source-drain path through which a differential current between the second constant current and a current flowing through a source-drain path of the fourth transistor flows;
   a sixth transistor being current mirror-connected to the fifth transistor; and
   a seventh transistor being coupled in series to the sixth transistor and outputting a current flowing by being complementarily turned ON/OFF for the third transistor as the second current.

7. The semiconductor device according to claim 6, further comprising:
   a pulse signal switching circuit selecting the pulse signal or an inverted signal thereof which is output to the current converter and the transmission electrode,
   wherein the third transistor in the current converter turns ON/OFF in response to an output signal of the pulse signal switching circuit, and
   wherein the seventh transistor in the current converter turns ON/OFF in response to an inverted signal of the output signal of the pulse signal switching circuit.

8. The semiconductor device according to claim 6, wherein the current converter further comprises a current-mirror circuit controlling a current flowing through a source-drain path of the second transistor depending on the current flowing through the source-drain path of the first transistor.

9. The semiconductor device according to claim 8, wherein the current-mirror circuit comprises:
   an eighth transistor being current mirror-connected to the first transistor;
   a ninth transistor being coupled in series to the eighth transistor and having a conductivity type different from a conductivity type of the eighth transistor;

a tenth transistor being current mirror-connected to the ninth transistor and having a same conductivity type as the conductivity type of the ninth transistor; and an eleventh transistor being coupled in series to the tenth transistor and having a same conductivity type as the conductivity type of the eighth transistor, and wherein the second transistor is current mirror-connected to the eleventh transistor.

10. The semiconductor device according to claim 8, wherein the current converter further comprises:

a twelfth transistor complementarily turning ON/OFF for the third transistor, and providing a charge to a first node between the second transistor and the third transistor when the twelfth transistor turns ON, and a thirteenth transistor complementarily turning ON/OFF for the seventh transistor, and providing a charge to a second node between the sixth transistor and the seventh transistor when the thirteenth transistor turns ON.

11. The semiconductor device according to claim 10, further comprising a dummy transistor, wherein the current converter includes a first output terminal and a second output terminal, and outputs the second current through the first output terminal for the current-controlled oscillator, wherein the dummy transistor is provided between a power supply voltage terminal and the second output terminal, wherein the twelfth transistor is provided between the first node and the second output terminal, and wherein the thirteenth transistor is provided between the second node and the second output terminal.

12. The semiconductor device according to claim 11, wherein the dummy transistor comprises a same conductivity type and a same size and a same shape as an input stage transistor of the current-controlled oscillator.

13. A semiconductor system comprising:

an electrode pair, and the semiconductor device according to claim 1.

* * * * *